US012794426B2

(12) United States Patent
Saito

(10) Patent No.: US 12,794,426 B2
(45) Date of Patent: Nov. 10, 2026

(54) EQUALIZER CIRCUIT

(71) Applicant: ROHM CO., LTD., Kyoto (JP)

(72) Inventor: Shinichi Saito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 592 days.

(21) Appl. No.: 18/361,078

(22) Filed: Jul. 28, 2023

(65) Prior Publication Data

US 2024/0039495 A1 Feb. 1, 2024

(30) Foreign Application Priority Data

Jul. 28, 2022 (JP) ................................ 2022-120817

(51) Int. Cl.

*H03F 3/45* (2006.01)
*H03F 1/32* (2006.01)
*H03G 1/00* (2006.01)

(52) U.S. Cl.

CPC ....... *H03F 3/45183* (2013.01); *H03F 1/3205* (2013.01); *H03F 3/45273* (2013.01); *H03G 1/0088* (2013.01)

(58) Field of Classification Search

None

See application file for complete search history.

(56) References Cited

U.S. PATENT DOCUMENTS 7,598,811 B2 * 10/2009 Cao ...................... H03G 1/0088 330/254
8,335,249 B1 * 12/2012 Su ....................... H03F 3/45197 375/232
2019/0305810 A1 * 10/2019 Pham ................. H04L 25/0272

OTHER PUBLICATIONS

Rahman et al., “6.6: A 22.5-to-32Gb/s 3.2pJ/b Referenceless Baud-Rate Digital CDR with DFE and CTLE in 28nm CMOS”, 2017 IEEE International Solid-State Circuits Conference, 35 pages.

* cited by examiner

*Primary Examiner* — Andrea Lindgren Baltzell
*Assistant Examiner* — Malane Lieng
(74) *Attorney, Agent, or Firm* — CANTOR COLBURN LLP

(57) ABSTRACT

An equalizer circuit includes a variable gain equalizer circuit. A third transistor MN for gain adjustment is coupled between a source of a first transistor that constitutes an input differential pair of the variable gain equalizer circuit, and a first current source IB. A fourth transistor MN for gain adjustment is coupled between a source of a second transistor that constitutes the input differential pair, and a second current source IB. A first bias voltage Vb is supplied to the gates of the third transistor MN and the fourth transistor MN, so as to enable DC gain control of the variable gain equalizer circuit.

8 Claims, 8 Drawing Sheets

EQUALIZER CIRCUIT

CROSS REFERENCES TO RELATED APPLICATIONS

The present invention claims priority under 35 U.S.C. § 119 to Japanese Application, 2022-120817, filed on Jul. 28, 2022, the entire contents of which being incorporated herein by reference.

BACKGROUND

1. Technical Field

The present disclosure relates to an equalizer circuit.

2. Description of the Related Art

Although the non-return-to-zero (NRZ) method has been the mainstream of serial data transmission, applications that require higher transmission rate have employed the multi-level PAM method such as pulse amplitude modulation (PAM) 4.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Figure 1:
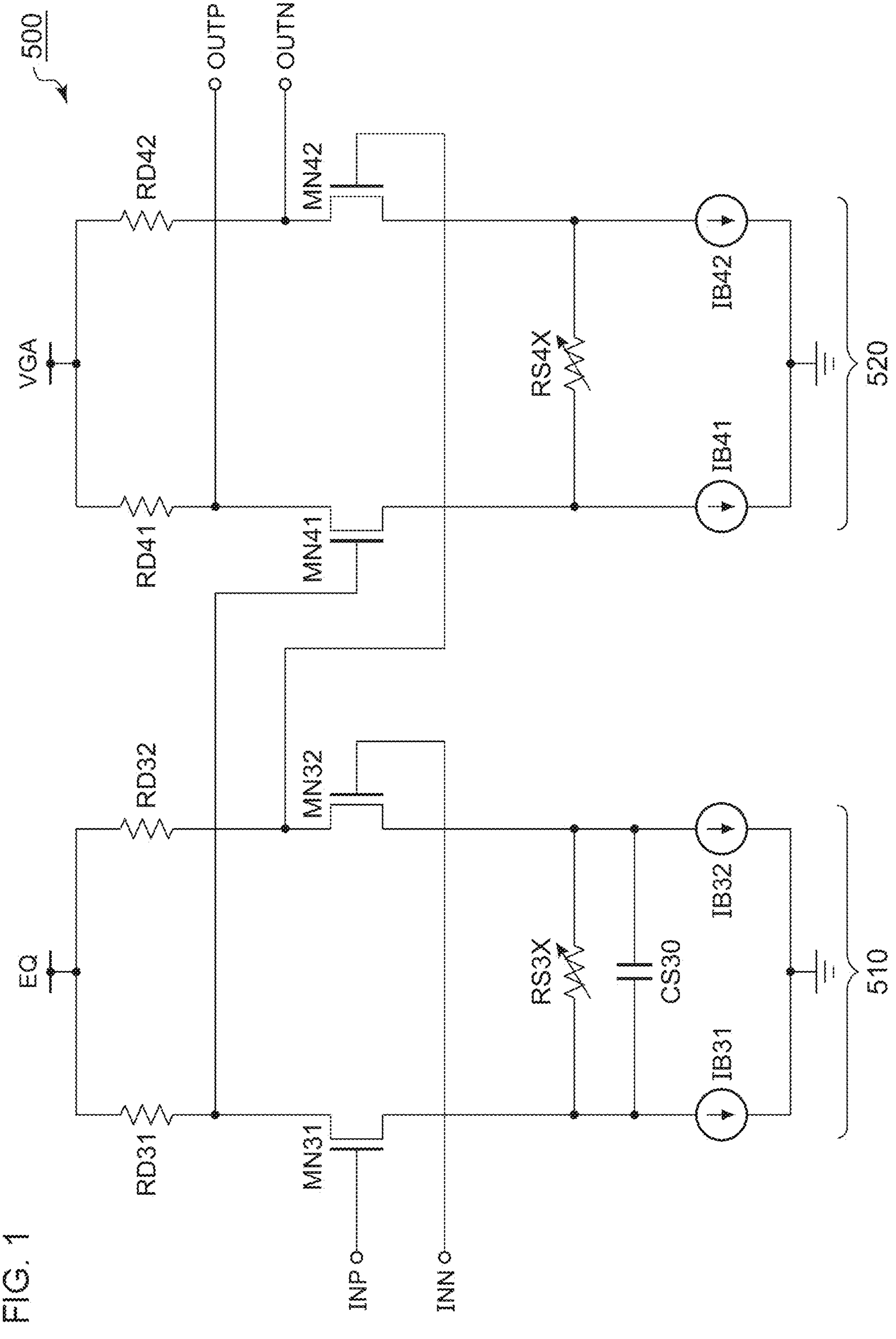
FIG. 1 is a circuit diagram of an equalizer circuit according to a comparative technique.

An outline of several example embodiments of the disclosure follows. This outline is provided for the convenience of the reader to provide a basic understanding of such embodiments and does not wholly define the breadth of the disclosure. This outline is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

An equalizer circuit according to an embodiment includes a variable gain equalizer circuit, and a first bias circuit structured to generate a first bias voltage. The variable gain equalizer circuit includes: a first input terminal; a second input terminal; a first transistor having a gate coupled to the first input terminal; a second transistor having a gate coupled to the second input terminal; a first resistor coupled to a drain of the first transistor; a second resistor coupled to a drain of the second transistor; a first current source; a second current source; a third transistor coupled between a source of the first transistor and the first current source, with a first bias voltage applied to the gate; a fourth transistor coupled between a source of the second transistor and the second current source, with a first bias voltage applied to the gate; a third resistor coupled between a connection node of the third transistor and the first current source, and a connection node of the fourth transistor and the second current source; and a capacitor coupled in parallel to the third resistor.

With the third resistor and the capacitor (also referred to as an inter-source capacitor) thus combined in this structure, the variable gain equalizer circuit functions as a high frequency emphasis filter. The variable gain equalizer circuit, whose gain is variable as the first bias voltage changes, also functions as a variable gain amplifier. That is, this structure can amplify and equalize a received signal at a time in one stage. This successfully reduces a circuit area and power consumption, as compared with a structure having an amplifier and an equalizer in independent stages.

The structure can suppress excessive amplification in multi-level reception waveform and can equalize the signal while keeping the multi-level uniform.

In one embodiment, the third resistor may have variable resistance. This makes the equalizing characteristic adjustable depending on the resistance of the third resistor.

In one embodiment, the third resistor may be constituted by a combination of a plurality of resistors and a plurality of switches, and the resistance of the third resistor may be digitally controllable.

In one embodiment, the third resistor may include a field effect transistor. The equalizer circuit may further include a second bias circuit structured to supply a second bias voltage to the gate of the field effect transistor.

In one embodiment, a plurality of variable gain equalizer circuits may be coupled in series.

In one embodiment, a plurality of variable gain equalizer circuits may be coupled in series. The third resistor may include a field effect transistor. The equalizer circuit may further include a second bias circuit structured to supply a second bias voltage commonly to a gate of each field effect transistor that constitutes the third resistor in each of the variable gain equalizer circuits.

In one embodiment, the first bias circuit may further include at least one current D/A converter structured to convert a digital input into a gradated current output; and an UV conversion circuit structured to convert an output current from the at least one current D/A converter to the first bias voltage.

In one embodiment, the second bias circuit may further include at least one current D/A converter structured to convert a digital input into a gradated current output; and an UV conversion circuit structured to convert an output current from the at least one current D/A converter to the second bias voltage.

In one embodiment, the equalizer circuit may be integrally mounted on one semiconductor substrate. The term "integrally mounted" encompasses a case where all components of the circuit are formed on the semiconductor substrate, and a case where essential components of the circuit are integrally mounted, while allowing external provision, for example, of a part of resistors or capacitors for adjusting a circuit constant. The integration of the circuit on one chip can reduce the circuit area and can keep the characteristics of the circuit elements uniform.

Embodiments

Preferred embodiments will be explained below, referring to the attached drawings. All similar or equivalent constituents, members and processes illustrated in the individual drawings will be given same reference numerals, so as to properly avoid redundant explanations. The embodiments are merely illustrative and are not restrictive about the invention. All features and combinations thereof described in the embodiments are not always necessarily essential to the disclosure and invention.

In the present specification, a "state in which member A is coupled to member B" includes a case where the member A and the member B are physically and directly coupled, and a case where the member A and the member B are indirectly coupled via some other member that does not substantially affect the electrically coupled state between the members A and B, or does not degrade the function or effect demonstrated by the coupling thereof.

Similarly, a "state in which member C is provided between member A and member B" includes a case where the member A and the member C, or the member B and the member C are directly coupled, and a case where they are indirectly coupled, while placing in between some other member that does not substantially affect the electrically coupled state among the members or does not degrade the function or effect demonstrated by the members.

In the present specification, reference signs attached to electric signals such as voltage signal and current signal, or circuit elements such as resistor, capacitor, and inductor represent voltage value, current value, or circuit constants (resistance, capacitance, and inductance) of the individual components as necessary.

The present embodiment will explain an equalizer circuit that shapes multi-level including PAM4 signal. The equalizer circuit is now defined to have a variable gain amplification (VGA) function and an equalizing function.

VGA Function

A multi-value signal receiver has a quantizer (A/D converter) structured to judge a level of a received signal that can take multi-levels. The level of the received signal attenuates in a transmission path, with the degree of attenuation dependent on the length of the transmission path. The receiver thus needs to amplify the received signal with an appropriate gain, so as to be adapted to the input range of the quantizer. This refers to as VGA function.

Equalizing Function

The multi-level signal transmitted through the transmission path attenuates more largely in the high-frequency component thereof, as compared with the low-frequency component, which is a causal factor of waveform distortion of the received signal. In order to correct this waveform distortion, the frequency components contained in the received signal need to be corrected. This refers to as equalizing function.

First, an equalizer circuit 500 according to a comparative technique examined by the present inventors will be described.

FIG. 1 is a circuit diagram of an equalizer circuit 500 according to a comparative technique. The equalizer circuit 500 is constituted by two stages that are an equalizer circuit 510 and a variable gain amplifier 520, and functions as a waveform shaping circuit structured to shape the waveform of an input differential signal.

The equalizer circuit 510 in the preceding stage and the variable gain amplifier 520 in the subsequent stage have the same basic configuration and are constituted by differential amplifiers. The differential amplifier has input differential paired transistors MN #1, MN #2, load resistors RD #1, RD #2, and bias current sources IB #1 and IB #2. Now #=3 holds for the equalizer circuit 510, and #=4 holds for the variable gain amplifier 520.

The equalizer circuit 510 has a parallel connection circuit composed of a resistor RS3X and a capacitor CS30, which is connected between the sources of the input differential paired transistors MN31, MN32. The equalizer circuit 510 has a frequency characteristic which is determined according to the circuit constants of the resistor RS3X and the capacitor CS30. For example, the resistor RS3X is constituted by a variable resistor, and according to the resistance thereof, the frequency characteristic is adjustable.

The variable gain amplifier 520 has a resistor RS4X coupled between the sources of the input differential paired transistors MN41, MN42. The resistor RS4X is a variable resistor, and according to the resistance thereof, the gain of the variable gain amplifier 520 is adjustable.

The present inventors examined the equalizer circuit 500 in FIG. 1, to find the following problems.

In multi-level PAM signaling, a plurality of signal levels that correspond to the multi-valued states are evenly distributed. If the MOS transistor of the equalizer circuit 510 in the preceding stage has a large amplification capability, the multi-level PAM signal formerly having uniform multi-levels will be excessively amplified during passage through the equalizer circuit 510, resulting in a distorted waveform that demonstrates uneven distribution of the multi-levels.

Another problem is that the equalizer circuit 510 and the variable gain amplifier 520 are structured in independent stages, thus needing large circuit area and large current consumption.

The paragraphs below will explain an equalizer circuit in which the problems in the comparative technique illustrated in FIG. 1 were improved.

Figure 2:
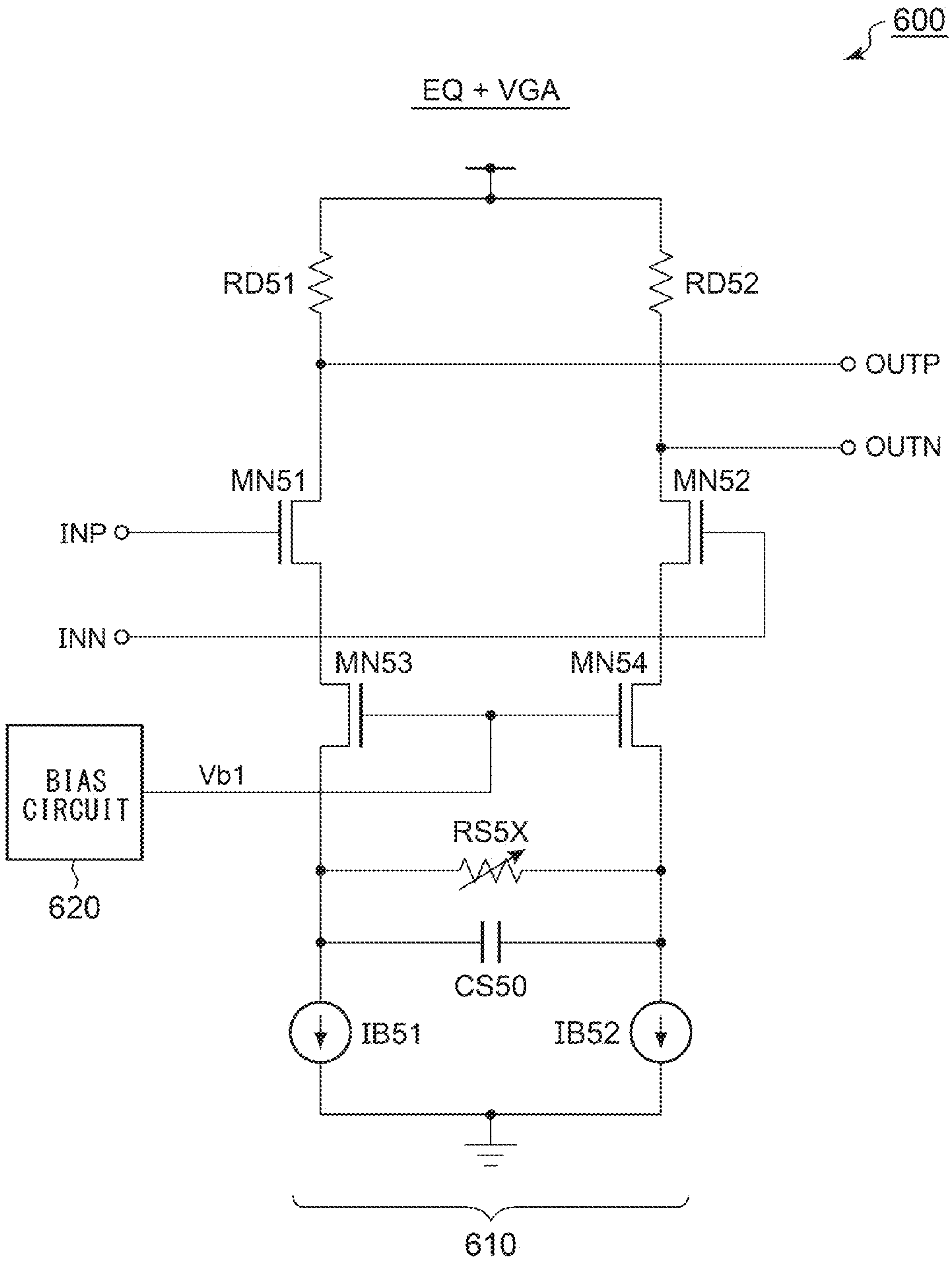
FIG. 2 is a circuit diagram of an equalizer circuit according to an embodiment.

FIG. 2 is a circuit diagram of an equalizer circuit 600 according to an embodiment. The equalizer circuit 600 has a variable gain equalizer circuit 610 and a first bias circuit 620. The equalizer circuit 600 is a functional integrated circuit (IC) integrally mounted on one semiconductor substrate.

The first bias circuit 620 generates a first bias voltage Vb1.

The variable gain equalizer circuit 610 includes a first input terminal INP, a second input terminal INN, a first transistor MN51, a second transistor MN52, a third transistor MN53, a fourth transistor MN54, a first resistor RD51, a second resistor RD52, a third resistor RS5X, a first current source IB51, a second current source IB52, and a capacitor CS50.

The first transistor MN51 and the second transistor MN52 constitute an input differential pair, with the gate of the first transistor MN51 coupled to the first input terminal INP, and with the gate of the second transistor MN52 coupled to the second input terminal INN.

The first resistor RD51 is coupled between the drain of the first transistor MN51 and the power line. The second resistor RD52 is coupled between the drain of the second transistor MN52 and the power line.

The first current source IB51 and the second current source IB52 generate constant current.

The third transistor MN53 is coupled between the source of the first transistor MN51 and the first current source IB51 and has the gate to which the first bias voltage Vb1 generated by the first bias circuit 620 is applied. The fourth transistor MN54 is coupled between the source of the second transistor MN52 and the second current source IB52 and has the gate to which the first bias voltage Vb1 is applied.

The third resistor RS5X is coupled between a connection node of the third transistor MN53 and the first current source IB51 (the source of the third transistor MN53), and a connection node of the fourth transistor MN54 and the second current source IB52 (the source of the fourth transistor MN54). The capacitor CS50 is coupled between the source of the third transistor MN53 and the source of the fourth transistor MN54, and in parallel with the third resistor RS5X. The capacitor CS50 is also referred to as an inter-source capacitor.

The third resistor RS5X may be a variable resistor whose resistance can vary. In place of or in addition to the resistance of the third resistor RS5X, also the capacitance of the capacitor CS50 may be variable.

The equalizer circuit 600 is thus structured.

With the third resistor RS5X and the capacitor CS50 thus combined in this structure, the variable gain equalizer circuit 610 functions as a high frequency emphasis filter. The variable gain equalizer circuit 610, whose gain is variable by changing the first bias voltage Vb1, also functions as a variable gain amplifier. More specifically, as the first bias voltage Vb1 increases, in other words, as the gate-to-source voltage of the third transistor MN53 and the fourth transistor MN54 increases, the variable gain equalizer circuit 610 will have increased gain, conversely, as the first bias voltage Vb1 decreases, or as the gate-to-source voltages of the third transistor MN53 and the fourth transistor MN54 decreases, the variable gain equalizer circuit 610 will have decreased gain. The gain covers the entire range including DC component and is also referred to as DC gain.

That is, this structure can amplify and equalize an input signal at a time in one stage. This successfully reduces a circuit area and power consumption, as compared with the comparative technique illustrated in FIG. 1 having the amplifier and the equalizer in independent stages.

The structure illustrated in FIG. 2 can also suppress excessive amplification in multi-level reception waveform and can equalize the signal while keeping the multi-level uniform.

Furthermore, with use of a variable resistor as the third resistor RS5X, the variable gain equalizer circuit 610 will have an adjustable equalizing characteristic.

Figure 3:
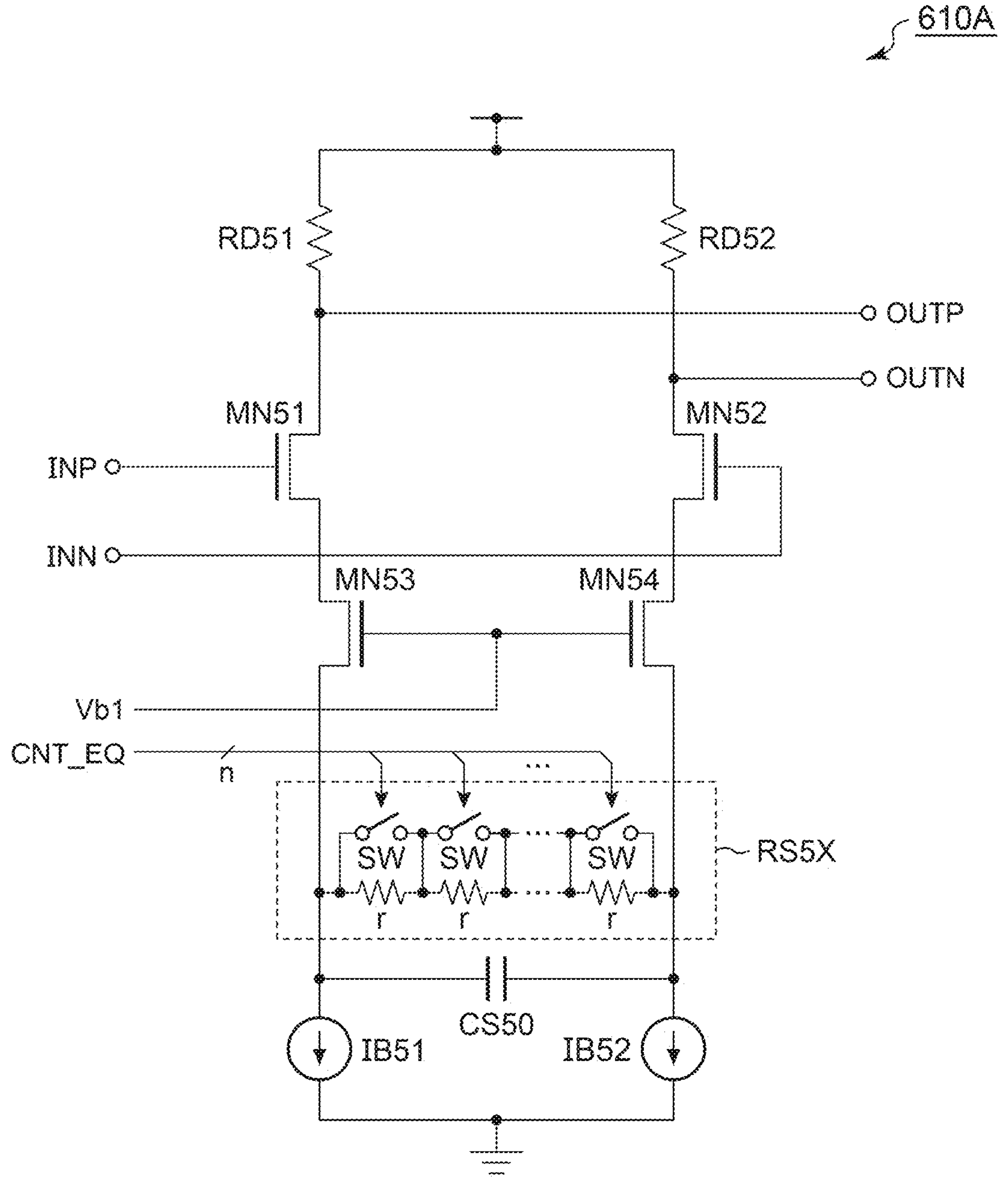
FIG. 3 is a circuit diagram of a variable gain equalizer circuit according to Example 1.

FIG. 3 is a circuit diagram of a variable gain equalizer circuit 610A according to Example 1. The third resistor RS5X is a variable resistor whose resistance is controllable according to a control signal CNT_EQ, and is constituted by a combination of a plurality of resistors r and a plurality of switches sw. The plurality of resistors and the plurality of switches may follow a topology not specifically limited, to which any of known techniques is applicable.

Some actual application would be short of the gain or would fail in obtaining appropriate equalizing characteristic, only with the variable gain equalizer circuit 610 in a single stage. In this case, a plurality of variable gain equalizer circuits 610 may be coupled in multiple stages.

Figure 4:
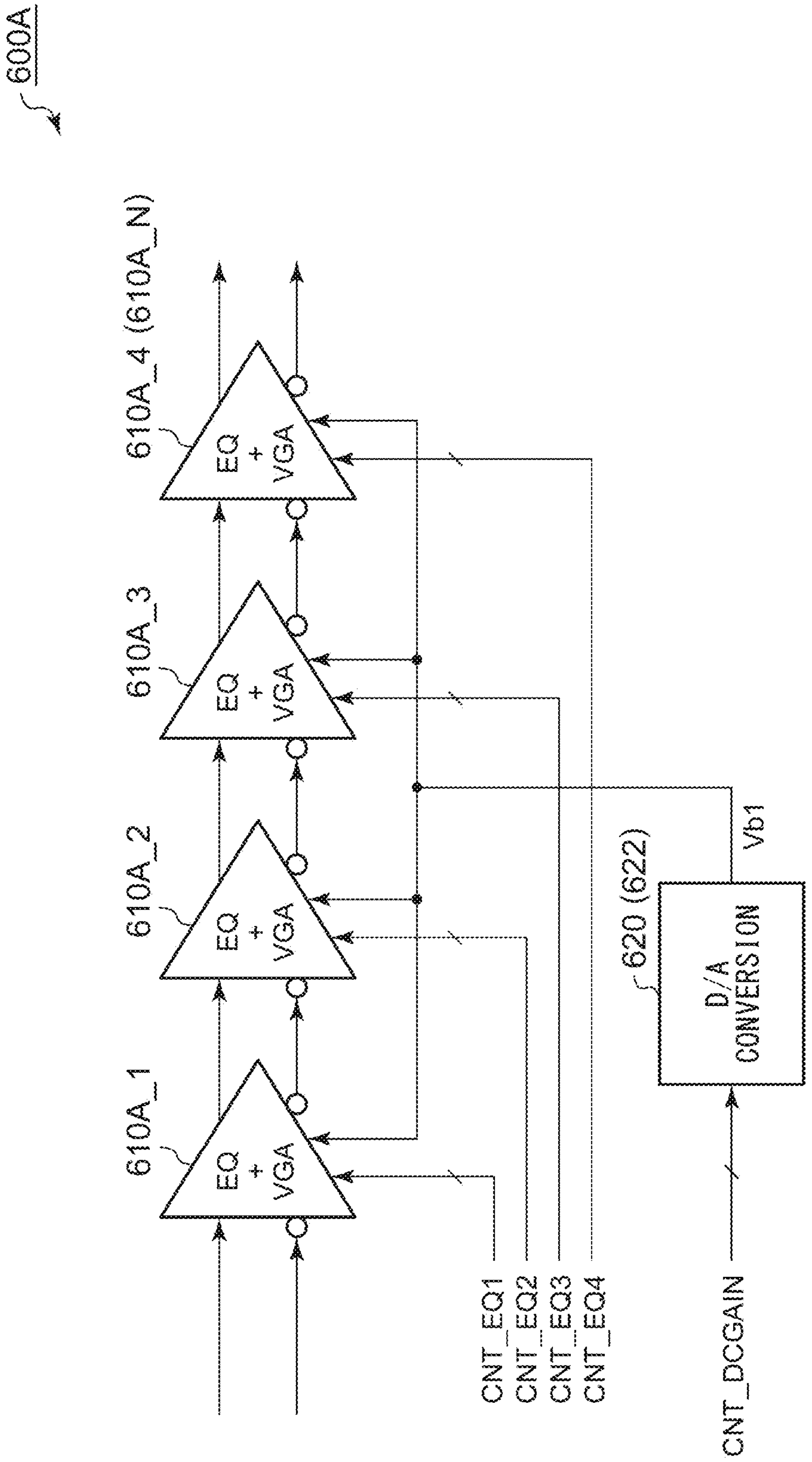
FIG. 4 is a circuit diagram of a receiver having the variable gain equalizer circuit illustrated in FIG. 3.

FIG. 4 is a circuit diagram of an equalizer circuit 600A having the variable gain equalizer circuit 610A illustrated in FIG. 3. The equalizer circuit 600A has a plurality of variable gain equalizer circuits 610A_1 to 610A_N coupled in series, and a first bias circuit 620, where N=4 holds in this example.

In this structure, the DC gain of the variable gain equalizer circuits 610A_1 to 610A_N is controlled by the common first bias voltage Vb1, and thus the variable gain equalizer circuits 610A_1 to 610A_N have the same DC gain.

More specifically, the first bias circuit 620 is provided in common for the plurality of variable gain equalizer circuits 610A_1 to 610A_N, so that the same first bias voltage Vb1 is supplied to the variable gain equalizer circuits 610A_1 to 610A_N.

On the other hand, the equalizer characteristic of the variable gain equalizer circuits 610A_1 to 610A_N in this structure is independently adjustable. Each variable gain equalizer circuit 610A_i (i=1, 2, . . . N) contains the digitally controllable variable resistor RS5X as illustrated in FIG. 3, to which a set value CNT_EQi for each equalizer is supplied.

For example, the first bias circuit 620 may contain a D/A converter 622 that converts a digital gain set value CNT_DCGAIN into the analog first bias voltage Vb1.

Figure 5:
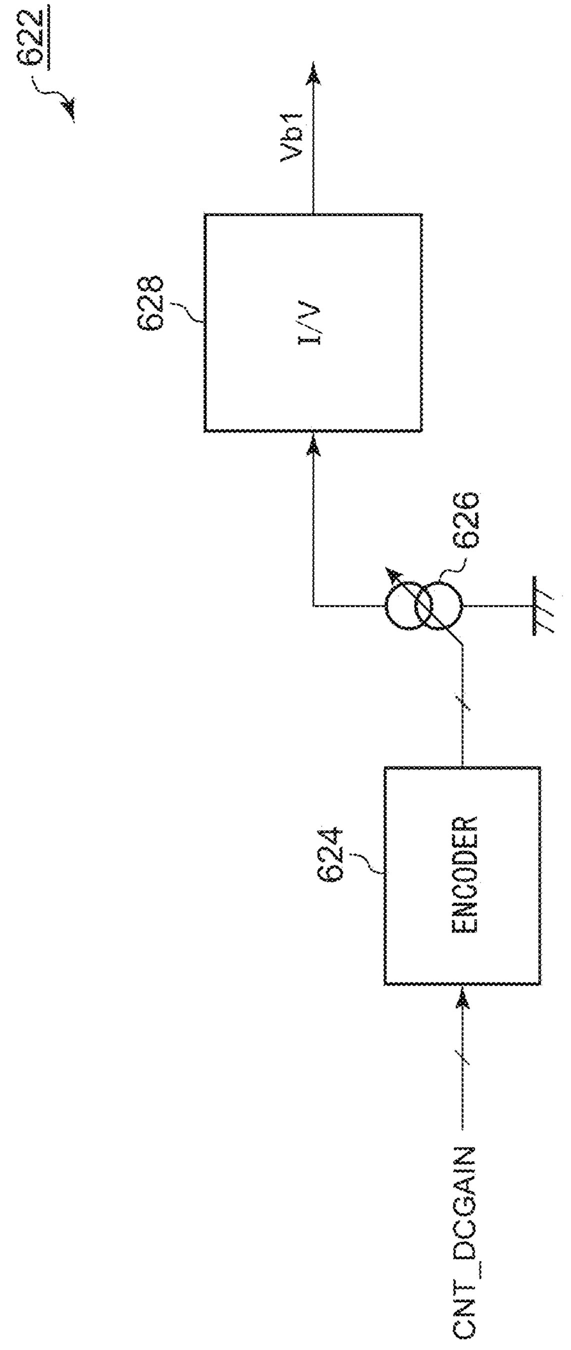
FIG. 5 is a circuit diagram illustrating an exemplary configuration of a D/A converter that functions as a bias circuit.

FIG. 5 is a circuit diagram illustrating an exemplary configuration of a D/A converter 622 that functions as the first bias circuit 620. The D/A converter 622 includes an encoder 624, a current DAC (D/A converter) circuit 626, and an I/V conversion circuit 628. The encoder 624 encodes a set value of CNT_DCGAIN, and the current DAC circuit 626 generates a current Idac according to the output of the encoder 624. The I/V conversion circuit 628 converts the current Idac into the first bias voltage Vb1. Note that the configuration of the D/A converter 622 is not particularly limited, to which the resistor division method for example is applicable.

Figure 6:
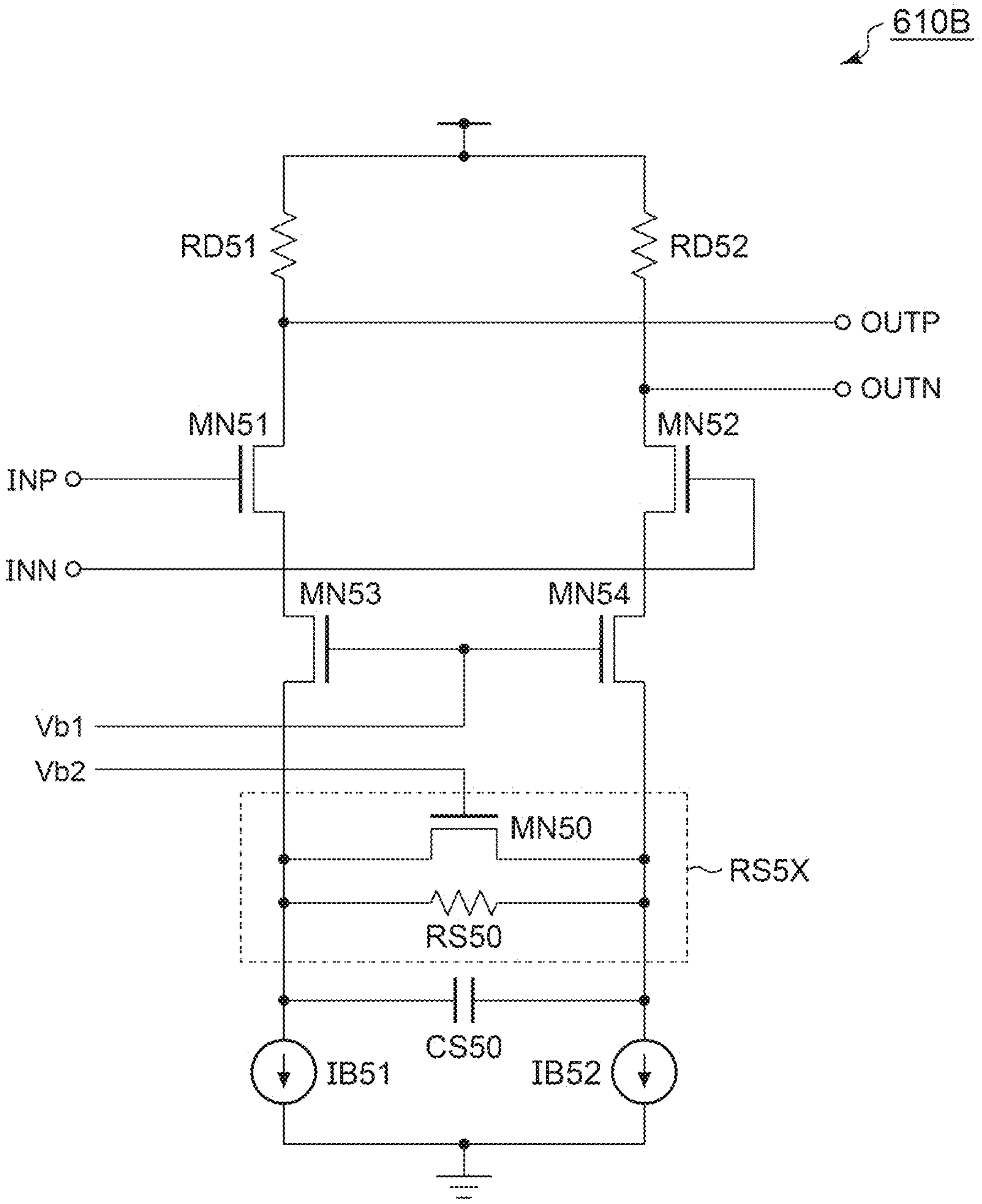
FIG. 6 is a circuit diagram of a variable gain equalizer circuit according to Example 2.

FIG. 6 is a circuit diagram of a variable gain equalizer circuit 610B according to Example 2. In Example 2, the DC gain of the variable gain equalizer circuit 610B is controllable according to the first bias voltage Vb1 supplied to the gates of the transistors MN53 and MN54, similarly to Example 1.

On the other hand, the resistance of the third resistor RS5X is controllable according to the analog second bias voltage Vb2.

The third resistor RS5X contains a resistor RS50 and a transistor MN50 coupled in parallel. The transistor MN50 is an N-channel transistor and is coupled between the source of the third transistor MN53 and the source of the fourth transistor MN54.

The variable gain equalizer circuit 610B is thus structured. The fifth transistor MN50 varies the impedance according to the analog second bias voltage Vb2, whereby the combined impedance of the third resistor RS5X varies. This successfully controls the equalizer characteristic of the variable gain equalizer circuit 610B, according to the second bias voltage Vb2.

Figure 7:
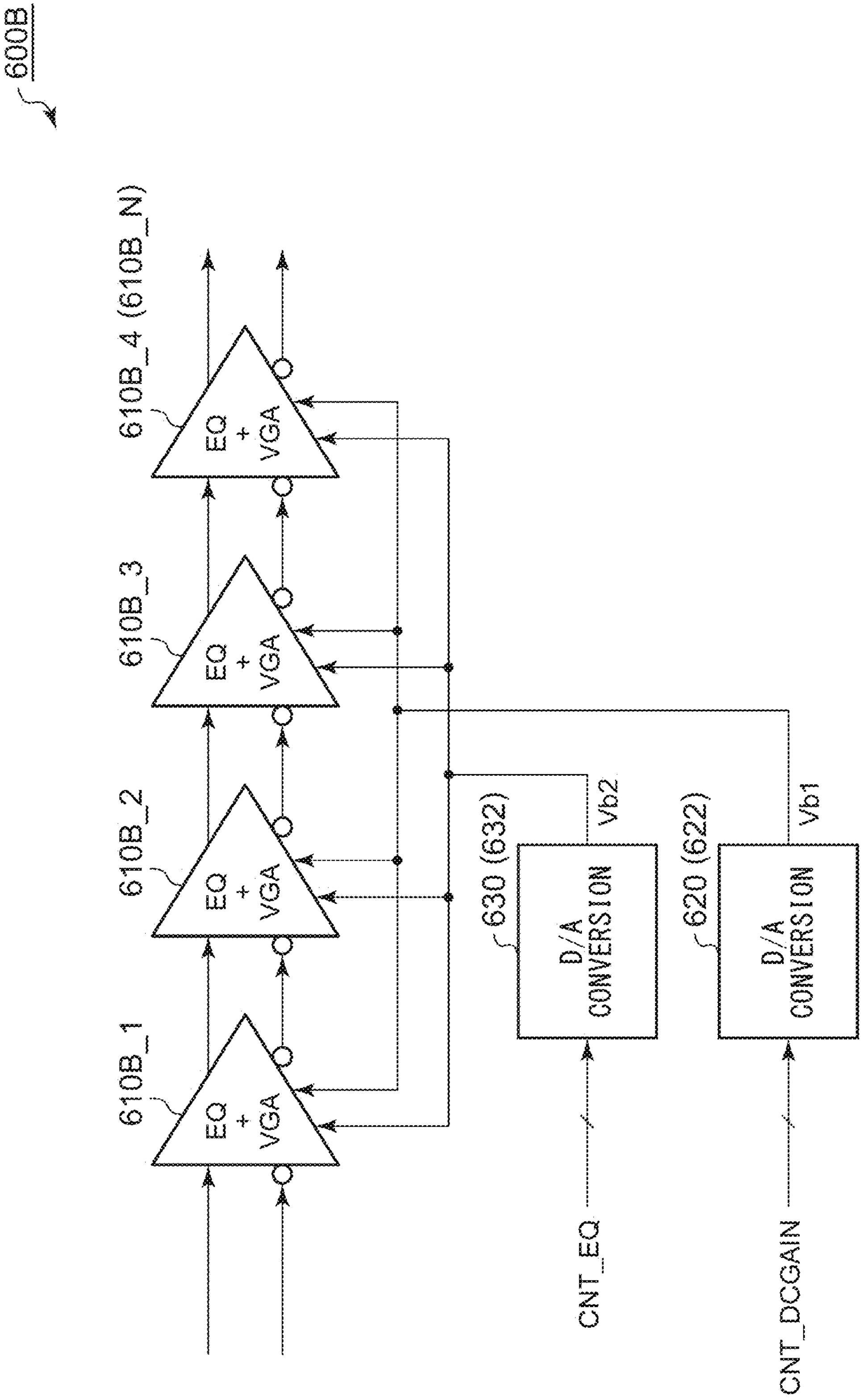
FIG. 7 is a circuit diagram of a receiver having the variable gain equalizer circuit illustrated in FIG. 6.

FIG. 7 is a circuit diagram of an equalizer circuit 600B having the variable gain equalizer circuit 610B illustrated in FIG. 6. The equalizer circuit 600B has a plurality of variable gain equalizer circuits 610B_1 to 610B_N coupled in series, a first bias circuit 620, and a second bias circuit 630, where N=4 holds in this example.

In this structure, the DC gain of the variable gain equalizer circuits 610B_1 to 610B_N is controlled by the common first bias voltage Vb1, and thus the variable gain equalizer circuits 610B_1 to 610B_N have the same DC gain. This aspect is similar to that in FIG. 4. More specifically, the first bias circuit 620 is provided in common for the plurality of variable gain equalizer circuits 610B_1 to 610B_N, so that the same first bias voltage Vb1 is supplied to the variable gain equalizer circuits 610B_1 to 610B_N.

Also the equalizer characteristic of the variable gain equalizer circuits 610B_1 to 610B_N is controlled by the common second bias voltage Vb2, and thus the variable gain equalizer circuits 610B_1 to 610B_N have the same equalizer characteristic. This aspect is different from that in FIG. 4.

More specifically, the second bias circuit 630 is provided in common to the plurality of variable gain equalizer circuits 610B_1 to 610B_N, so that the same second bias voltage Vb2 is supplied to the variable gain equalizer circuits 610B_1 to 610B_N. For example, the second bias circuit 630 may contain a D/A converter 632 that converts a digital equalizer set value CNT_EQ into the analog second bias voltage Vb2. The D/A converter 632 may have the same structure as the D/A converter 622, typically as illustrated in FIG. 5.

Applications

Figure 8:
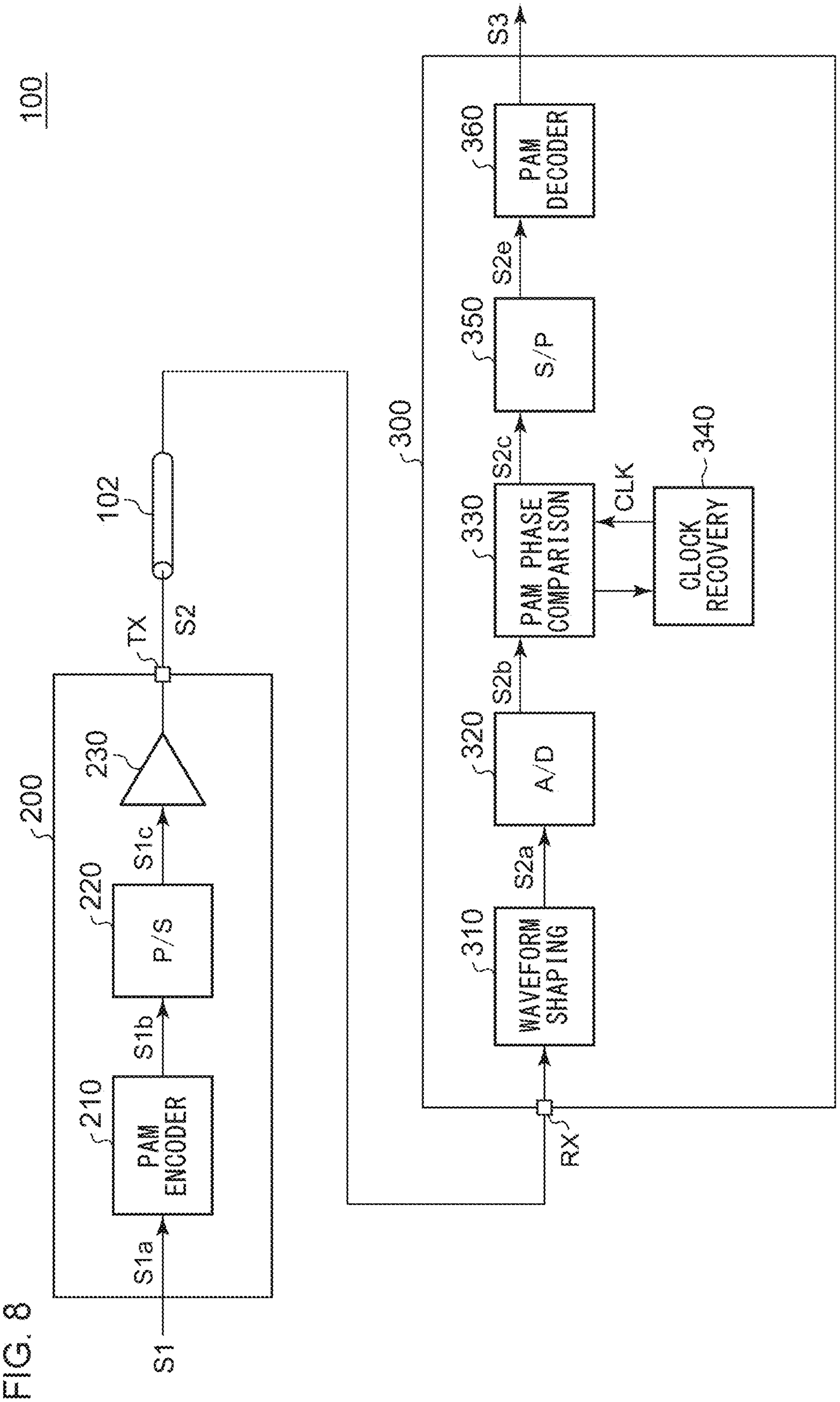
FIG. 8 is a block diagram of a transmission system of an N-level PAM (PAM-N) signal according to an embodiment.

FIG. 8 is a block diagram of a transmission system 100 of an N-level PAM (PAM-N) signal according to an embodiment. The transmission system 100 has a transmitter 200, and a receiver (de-serializer) 300. The transmitter 200 and the receiver 300 are coupled with a transmission cable 102.

Transmitter

The transmitter 200 is a serializer integrated circuit (IC) that receives, from an unillustrated external circuit, data S1 to be transmitted to the receiver 300, converts the data S1 into an N-value PAM signal S2, and transmits it to the receiver 300. The parallel data S1 may be of any type and is exemplified by image data whose large size needs to be transmitted at high speed.

Receiver

The receiver 300 is a de-serializer IC that receives a PAM-N signal S2 from the transmitter 200, and outputs it as output data S3 to some other external circuit not illustrated. Signal transmission between the transmitter 200 and the receiver 300 may rely upon differential signal, or upon single-ended signal.

Although the description below will deal with 4-level (N=4) PAM (PAM4) as an exemplary case of the PAM-N signal, the present disclosure is also applicable to 8-level, 16-level, or 64-level signal without limitation on the number of gradations of the PAM signal.

First, a configuration of the transmitter 200 will be described. A PAM encoder 210 converts data Sla into data S1*b* in the PAM format. The data S1*b* has a clock signal embedded in the PAM encoder 210. The PAM encoder 210 can employ an encoding method not particularly limited, which includes DC balanced encoding method such as 8*b*10*b*, 10*b*12*b*, and 64*b*66*b*.

A P/S converter 220 converts the data S1*b* generated by the PAM encoder 210 into serial data S1*c*. A PAM driver 230 converts the serial data S1*c* into the analog PAM-N signal S2, and outputs it.

Next, a configuration of the receiver 300 will be explained. The receiver 300 includes a waveform shaping circuit 310, an A/D converter 320, a PAM phase comparator 330, a clock recovery circuit 340, an S/P converter 350, and a PAM decoder 360.

The PAM-N signal S2 would cause waveform distortion while transmitting through the transmission cable 102. The waveform shaping circuit 310 is provided for improving the waveform distortion. Causes for the waveform distortion are exemplified by attenuation due to transmission loss, and low-pass action of the transmission cable 102. The waveform shaping circuit 310 shapes the waveform of the PAM-N signal S2 to get closer to an ideal PAM signal.

The waveform shaping circuit 310 may have a variable gain amplification (VGA) function that amplifies the PAM-N signal S2 with a variable gain to control the direct current (DC) amplitude of the PAM-N signal S2, and an equalizing (EQ) function that corrects a frequency characteristic of the PAM-N signal S2.

The A/D converter 320 quantizes a PAM-N signal S2*a* having the waveform shaped by the waveform shaping circuit 310 and converts it into a comparison signal S2*b*.

The PAM phase comparator 330 receives the comparison signal S2*b* and latches a plurality of bits b1 to b3 that constitute the comparison signal S2*b*, in synchronization with a clock signal CLK (data strobe signal) generated by the clock recovery circuit 340. The PAM phase comparator 330 then converts the comparison signal S2*b* latched by the clock signal CLK into a 2-bit binary code (symbol data) S2*c*.

The S/P converter 350 converts the binary code S2*c* into parallel data S2*e*. The PAM decoder 360 takes part in a process reverse to that of the PAM encoder 210 in the transmitter 200, that is, decodes the parallel data S2*e* after the DC balanced encoding, and outputs data S3.

The variable gain equalizer circuit 610 (610A, 610B) according to the aforementioned embodiment may be used as the waveform shaping circuit 310.

Supplement

In one aspect, the technology disclosed in the present specification may be understood as follows.

Item 1

An equalizer circuit comprising:
- a variable gain equalizer circuit; and
- a first bias circuit structured to generate a first bias voltage;

the variable gain equalizer circuit comprising:
- a first input terminal;
- a second input terminal;
- a first transistor having a gate coupled to the first input terminal;
- a second transistor having a gate coupled to the second input terminal;
- a first resistor coupled to a drain of the first transistor;
- a second resistor coupled to a drain of the second transistor;
- a first current source;
- a second current source;
- a third transistor coupled between a source of the first transistor and the first current source, with a first bias voltage applied to the gate;
- a fourth transistor coupled between a source of the second transistor and the second current source, with the first bias voltage applied to the gate;
- a third resistor coupled between a connection node of the third transistor and the first current source, and a connection node of the fourth transistor and the second current source; and
- a capacitor coupled in parallel to the third resistor.

Item 2

The equalizer circuit according to item 1, wherein resistance of the third resistor is variable.

Item 3

The equalizer circuit according to item 2, wherein the third resistor is constituted by a combination of a plurality of resistors and a plurality of switches, making the resistance of the third resistor digitally controllable.

Item 4

The equalizer circuit according to item 2, wherein the third resistor includes a fifth transistor, and the equalizer circuit further comprises a second bias circuit structured to supply a second bias voltage to a gate of the fifth transistor.

Item 5

The equalizer circuit according to any one of items 1 to 4, wherein a plurality of the variable gain equalizer circuits is coupled in series.

Item 6

The equalizer circuit according to item 2, wherein a plurality of the variable gain equalizer circuits is coupled in series, the third resistor includes a field effect transistor, and the equalizer circuit further comprises a second bias circuit structured to supply a second bias voltage commonly to a gate of each field effect transistor that constitutes the third resistor in each of the variable gain equalizer circuits.

Item 7

The equalizer circuit according to any one of items 1 to 6, wherein capacitance of the capacitor is variable.

Item 8

The equalizer circuit according to any one of items 1 to 7, wherein the first bias circuit comprises:

at least one current D/A converter structured to convert a digital input into a gradated current output; and an I/V conversion circuit structured to convert an output current from the at least one current D/A converter to the first bias voltage.

Item 9

The equalizer circuit according to items 4 or 6, wherein the second bias circuit comprises:

at least one current D/A converter structured to convert a digital input into a gradated current output; and an I/V conversion circuit structured to convert an output current from the at least one current D/A converter to the second bias voltage.

Item 10

The equalizer circuit according to any one of items 1 to 9, being integrally mounted on one semiconductor substrate.

Having described the embodiments according to the present disclosure with use of specific terms, the description is merely illustrative for better understanding, and by no means limits the disclosure or the claims. The scope of the present invention is defined by the claims, and therefore encompasses any embodiment, example, and modified example having not been described above.

What is claimed is:

1. An equalizer circuit comprising:

a variable gain equalizer circuit; and a first bias circuit structured to generate a first bias voltage;

the variable gain equalizer circuit comprising:

a first input terminal;

a second input terminal;

a first transistor having a first gate coupled to the first input terminal;

a second transistor having a second gate coupled to the second input terminal;

a first resistor coupled to a first drain of the first transistor;

a second resistor coupled to a second drain of the second transistor;

a first current source;

a second current source;

a third transistor coupled between a source of the first transistor and the first current source, with the first bias voltage applied to a third gate of the third transistor;

a fourth transistor coupled between a source of the second transistor and the second current source, with the first bias voltage applied to a fourth gate of the fourth transistor;

a third resistor coupled between a connection node of the third transistor and the first current source, and a connection node of the fourth transistor and the second current source; and a capacitor coupled in parallel to the third resistor, wherein resistance of the third resistor is variable,wherein the third resistor includes a fifth transistor, and the equalizer circuit further comprises a second bias circuit structured to supply a second bias voltage to a gate of the fifth transistor.

2. The equalizer circuit according to claim 1, wherein a plurality of the variable gain equalizer circuits is coupled in series.

3. An equalizer circuit comprising:

a variable gain equalizer circuit; and a first bias circuit structured to generate a first bias voltage;

the variable gain equalizer circuit comprising:

a first input terminal;

a second input terminal;

a first transistor having a first gate coupled to the first input terminal;

a second transistor having a second gate coupled to the second input terminal;

a first resistor coupled to a first drain of the first transistor;

a second resistor coupled to a second drain of the second transistor;

a first current source;

a second current source;

a third transistor coupled between a source of the first transistor and the first current source, with the first bias voltage applied to a third gate of the third transistor;

a fourth transistor coupled between a source of the second transistor and the second current source, with the first bias voltage applied to a fourth gate of the fourth transistor;

a third resistor coupled between a connection node of the third transistor and the first current source, and a connection node of the fourth transistor and the second current source; and a capacitor coupled in parallel to the third resistor, wherein resistance of the third resistor is variable, a plurality of the variable gain equalizer circuits is coupled in series, the third resistor includes a field effect transistor, and the equalizer circuit further comprises a second bias circuit structured to supply a second bias voltage commonly to a gate of each field effect transistor that constitutes the third resistor in each of the variable gain equalizer circuits.

4. The equalizer circuit according to claim 1, wherein capacitance of the capacitor is variable.

5. The equalizer circuit according to claim 1, wherein the first bias circuit comprises:

at least one current D/A converter structured to convert a digital input into a gradated current output; and an I/V conversion circuit structured to convert an output current from the at least one current D/A converter to the first bias voltage.

6. The equalizer circuit according to claim 1, wherein the second bias circuit comprises:

at least one current D/A converter structured to convert a digital input into a gradated current output; and an I/V conversion circuit structured to convert an output current from the at least one current D/A converter to the second bias voltage.

7. The equalizer circuit according to claim 1, being integrally mounted on one semiconductor substrate.

8. An equalizer circuit comprising:

a variable gain equalizer circuit; and a first bias circuit structured to generate a first bias voltage;

the variable gain equalizer circuit comprising:

a first input terminal;

a second input terminal;

a first transistor having a first gate coupled to the first input terminal;

a second transistor having a second gate coupled to the second input terminal;

a first resistor coupled to a first drain of the first transistor;

a second resistor coupled to a second drain of the second transistor;

a first current source;

a second current source;

a third transistor coupled between a source of the first transistor and the first current source, with the first bias voltage applied to a third gate of the third transistor;

a fourth transistor coupled between a source of the second transistor and the second current source, with the first bias voltage applied to a fourth gate of the fourth transistor;

a third resistor coupled between a connection node of the third transistor and the first current source, and a connection node of the fourth transistor and the second current source; and a capacitor coupled in parallel to the third resistor, wherein the first bias circuit comprises:

at least one current D/A converter structured to convert a digital input into a gradated current output; and an I/V conversion circuit structured to convert an output current from the at least one current D/A converter to the first bias voltage.

* * * * *